(12) United States Patent
Piechocinski

(10) Patent No.: US 10,589,984 B2
(45) Date of Patent: Mar. 17, 2020

(54) MEMS DEVICES AND PROCESSES

(71) Applicant: Cirrus Logic International Semiconductor Ltd., Edinburgh (GB)

(72) Inventor: Marek Sebastian Piechocinski, Edinburgh (GB)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 15/924,876

(22) Filed: Mar. 19, 2018

(65) Prior Publication Data

US 2018/0273372 A1    Sep. 27, 2018

Related U.S. Application Data

(60) Provisional application No. 62/475,913, filed on Mar. 24, 2017.

(30) Foreign Application Priority Data

May 5, 2017 (GB) .................................. 1707195.2

(51) Int. Cl.
| | |
|---|---|
| *B81B 3/00* | (2006.01) |
| *H04R 3/00* | (2006.01) |
| *H04R 19/00* | (2006.01) |
| *H04R 19/04* | (2006.01) |
| *H04R 31/00* | (2006.01) |
| *H04R 7/06* | (2006.01) |

(52) U.S. Cl.
CPC ............ *B81B 3/0072* (2013.01); *H04R 3/00* (2013.01); *H04R 19/005* (2013.01); *H04R 19/04* (2013.01); *H04R 31/00* (2013.01); *B81B 2201/0257* (2013.01); *B81B 2203/0127* (2013.01); *H04R 7/06* (2013.01); *H04R 2201/003* (2013.01); *H04R 2499/11* (2013.01)

(58) Field of Classification Search
CPC .......... B81B 3/0072; B81B 2203/0127; H04R 19/005; H04R 19/04; H04R 2201/003; H04R 7/06; H04R 2499/11; H04R 31/00; H04R 3/00
See application file for complete search history.

(56) References Cited

U.S. PATENT DOCUMENTS

2008/0200109 A1*  8/2008  Valencia ................ B60H 1/249
                                                        454/70
2012/0308053 A1* 12/2012  Dehe ........................ H04R 7/10
                                                        381/150

(Continued)

FOREIGN PATENT DOCUMENTS

| GB | 2506174 A | 3/2014 |
| GB | 2533410 A | 6/2016 |

OTHER PUBLICATIONS

International Search Report and Written Opinion of the International Searching Authority, International Application No. PCT/GB2018/050657, dated May 23, 2018.

(Continued)

*Primary Examiner* — Sonia L Gay
(74) *Attorney, Agent, or Firm* — Jackson Walker L.L.P.

(57) ABSTRACT

The application relates to MEMS microphone transducers having a vent structure provided in the membrane layer and an opening formed at the vent structure for tuning the frequency response of the microphone.

19 Claims, 11 Drawing Sheets

Typical Frequency Response (Measured)

(56) References Cited

U.S. PATENT DOCUMENTS

2014/0084396 A1* 3/2014 Jenkins ................ B81B 3/0021
257/419
2015/0014796 A1* 1/2015 Dehe .................... B81B 7/0016
257/416
2015/0041931 A1 2/2015 Szczech et al.
2015/0078593 A1 3/2015 Uchida
2016/0176704 A1 6/2016 Cargill et al.

OTHER PUBLICATIONS

Combined Search and Examination Report, UKIPO, Application No. GB1707195.2, dated Jul. 31, 2017.

* cited by examiner

Typical Frequency Response (Measured)

MEMS DEVICES AND PROCESSES

TECHNICAL FIELD

This application relates to micro-electro-mechanical system (MEMS) devices and processes, and in particular to a MEMS device and process relating to a transducer, for example a capacitive microphone.

BACKGROUND INFORMATION

MEMS devices are becoming increasingly popular. MEMS transducers, and especially MEMS capacitive microphones, are increasingly being used in portable electronic devices such as mobile telephone and portable computing devices.

Microphone devices formed using MEMS fabrication processes typically comprise one or more moveable membranes and a static backplate, with a respective electrode deposited on the membrane(s) and backplate, wherein one electrode is used for read-out/drive and the other is used for biasing. A substrate supports at least the membrane(s) and typically the backplate also. In the case of MEMS pressure sensors and microphones the read out is usually accomplished by measuring the capacitance between the membrane and backplate electrodes. In the case of transducers, the device is driven, i.e. biased, by a potential difference provided across the membrane and backplate electrodes.

To be suitable for use in portable electronic devices such transducers should be able to survive the expected handling and use of the portable device, which may include the device being subjected to loud noises and being accidentally dropped. These events may result in a high pressure impulse incident on the transducer. It has been found that in known MEMS transducers high pressure impulses can potentially lead to damage of the transducer.

To help prevent any damage which may be caused by these high pressure impulses it has been proposed that the MEMS transducer could be provided with at least one variable vent which can provide a variable size flow path between the front and back volumes. In a high pressure situation the variable vent(s) provide a relatively large flow path between the volumes so as to provide for relatively rapid equalisation between the volumes, reducing the extent and/or duration of a high pressure event on the membrane. At lower pressures however, within the expected normal operating range of the transducer, the size of the flow path is minimal or negligible.

The variable vent structure thus acts as a type of pressure relief valve to reduce the pressure differential acting on the membrane at relatively high pressure differentials. Such variable vent structures can thus be very useful for providing MEMS transducers, especially microphones, that can better survive high pressure events.

The frequency response of a microphone characterises its sensitivity level across the frequency spectrum. MEMS microphone performance can be measured by the frequency response i.e. the change in sensitivity at various frequencies. A flatter, linear, characteristic across the frequency range of interest is considered to be indicative of superior microphone performance. A typical frequency response figure shows an actual microphone's response across the frequency band.

FIG. 1 illustrates an example of a MEMS microphone frequency response. From FIG. 1 it can be seen that the MEMS microphone exhibits a generally flat frequency response characteristic across a wide band of frequencies but that the frequency response exhibits a drop, or "roll-off", at low-frequencies below 75-100 Hz. In other words, the sensitivity of the microphone becomes non-linear at low-frequencies. The frequency response characteristic also exhibits a resonant response at high frequencies above 10 k Hz.

The high/low frequency limits are described as the points at which the microphone response is 3 dB below/above the reference output level at 1 kHz. The reference level at 1 kHz is customarily normalized to 0 dB. The frequency response characteristic also includes the deviation limits from a flat response within the pass band. These values, expressed as units of ±x dB, show the maximum deviation of the output signal from a typical level between the −3 dB points. The −3 dB roll off frequency fc is defined as:

$$fc = 1/(2*PI*\text{Air flow resistance through the diaphragm}*\text{back volume compliance}).$$

The frequency response of a MEMS microphone varies due to a number of parameters including the location and/or geometry of the front and back chambers, and of the ventilation hole. Frequency response is also a function of the mechanical properties and compliance of the diaphragm.

It may be desirable to adjust or tune the frequency response of a MEMS transducer, in particular to tune the low-frequency response according to the intended or desired characteristics of the device.

Any venting or leaking through a membrane will cause a shift in the low-frequency roll-off point. In view of this, it is known to provide one or more openings or holes in the membrane layer of a MEMS transducer for tuning, or adjusting, the low-frequency response of the transducer. In particular, the −3 dB point may be adjusted by controlling the size and number of openings and thus the amount of air flow through the membrane.

A number of problems are associated with providing one or more openings in the membrane, according to previously considered transducer designs. In particular, any perforation in the membrane, particularly in the central region of the membrane where the membrane will undergo the greatest deflection in response to an incident differential pressure, may tend to weaken the membrane structure. Thus, the provision of openings for low-frequency tuning in the central region of the membrane may potentially undermine the robustness of the MEMS transducer, particularly in the case of MEMS transducers which require a significant number of openings. The openings may be located laterally outside the central region of the membrane towards the periphery of the membrane, however it will be appreciated that space is limited in this region. Furthermore, since the openings may alter the localised stress gradient exhibited by the membrane, leading to non-uniformities in the stress distribution, openings in the periphery of the membrane may potentially give rise to edge curl, which may degrade the performance of the microphone.

Embodiments of the present disclosure are directed to methods and apparatus for mitigating the problems associated with providing one or more openings in the membrane for tuning the low-frequency response of the membrane.

SUMMARY OF EMBODIMENTS

According to an example embodiment of a first aspect there is provided a MEMS transducer comprising:
a membrane layer;
at least one slit provided in the membrane layer to separate a region of the membrane layer from the rest of the membrane layer, the region forming a first moveable portion of a vent structure, the first moveable portion being able to deflect away from the plane of the rest of the membrane layer in response to a pressure differential across the membrane, wherein when the first moveable portion is substantially in-plane with the rest of the membrane layer, the vent structure comprises at least one opening in the membrane layer.

Thus, according to example embodiments, the vent structure is provided with at least one opening in the membrane material for tuning the frequency response, in particular the low frequency response, of the transducer.

The opening for tuning the frequency response of the transducer, which is provided at the vent structure, can be considered to be an area, or region, where the material forming the membrane layer is absent.

It will be appreciated that at normal acoustic/operating pressures the vent is preferably closed and the moveable portion thus extends substantially in plane with the rest of the membrane (i.e. the region of the membrane laterally surrounding the vent structure). The width of the slit that defines the moveable portion of the vent structure is considered to be minimal/negligible and does not represent an opening in the context of the present invention.

When the moveable portion extends substantially in plane with the rest of the membrane layer so as to substantially close the vent aperture, the perimeter of the opening will define a closed shape. The closed shape may be entirely bounded by the membrane material of the moveable portion. Thus, the opening can be considered to be formed through the moveable portion of the vent structure. Additionally, or alternatively, an opening may be provided at the periphery of the moveable portion. Thus, in this case, at least a part of the perimeter or peripheral edge of the opening will be provided by membrane material of the rest of the membrane layer. The part of the peripheral edge of the opening that is provided by the membrane material of the moveable portion will also form a section of the perimeter of the moveable portion. Thus, the opening will effectively be provided between i) the first moveable portion and ii) the rest of the membrane and/or a second moveable portion of the vent structure when movable portion is substantially in the same plane as the rest of the membrane layer. Thus, the moveable portion will appear to have a recess or cut-away portion at the peripheral edge thereof.

According to example embodiments, an opening provided at the vent structure for tuning the frequency response can be considered to extend in the plane of the first moveable portion. Thus, at least a section of the perimeter or peripheral edge of the opening is provided by membrane material of the moveable portion. It will be appreciated that the moveable portion, and thus the peripheral edge of the opening that is provided by membrane material of the moveable portion, will move in response to a pressure differential across the membrane. Together with the moveable portion, the plane of the opening can therefore be considered to deflect away from the plane of the rest of the membrane layer in response to a pressure differential across the vent structure.

The moveable portion of the vent structure is defined by at least one slit which extends through the membrane layer and serves to separate a region forming the moveable portion from the rest of the membrane, apart from at a narrow connecting portion.

The slit therefore serves to substantially isolate the moveable portion from the rest of the membrane layer. Thus, by locating the or each of the openings required for tuning the frequency response of the transducer at the vent structure, in particular through the moveable portion of the vent structure, any stresses arising in the membrane material as a consequence of the opening(s) will be substantially isolated from the rest of the membrane layer. Furthermore, the robustness of the membrane layer will be less affected by the provision of openings for tuning the low frequency response at the vent structure.

It will be appreciated that the vent structures associated with a MEMS transducer are typically provided laterally outside a central region of the membrane. Thus, by locating the openings away from the central region of the membrane layer, the strength and robustness of the membrane layer can be improved. Integrating tuning holes with one or more vent structures thus represents an effective and efficient arrangement, which beneficially frees up space on the rest of the membrane layer.

As previously mentioned, the vent structure remains substantially closed within the normal range of operating pressures (e.g. at pressure differentials in the range of 0-200 Pa (140 dB), 632 Pa (150 dB)). Thus, at normal operating pressures when the moveable portion is substantially in plane with the rest of the membrane, a first flow path through the membrane is provided by the one or more openings at the vent structure. In response to a significant pressure differential, e.g. above a given threshold of 1 kPa (such pressure differentials typically arising as a consequence of a high pressure event), the moveable portion of the vent structure will deflect to reveal the vent aperture and thus provide a second flow path through membrane. The size of the second flow path is variable and depends on the degree of deflection of the moveable portion, as well as the rise time of the high pressure impulse which can be on the order of 1 us-1000 us.

Thus, according to example embodiments, the MEMS transducer can be considered to comprise a dual flow-path vent structure which provides a first flow path through the membrane when the pressure differential across the membrane is below a first threshold, and a second flow path through the membrane when the pressure differential across the membrane is above a second threshold. The first threshold may be between 20 uPa (0 dB) and 1 kPa, the second threshold may be between 1 kPa and 20 kPa. The first flow path is for controlling and/or tuning the low frequency response of the transducer, whilst the second flow path is for protecting the membrane from damage during a high pressure event by facilitating the rapid equalisation of pressure across the membrane.

According to an example embodiment of a second aspect there is provided a method of manufacturing a MEMS transducer, comprising:

forming a membrane layer supported between a first volume and a second volume;

etching the membrane layer to form:

i) a channel which defines first moveable portion of a vent structure, ii) at least one opening through the membrane layer, the opening being provided at the vent structure.

According to an example embodiment of a third aspect there is provided a MEMS transducer comprising:

a membrane layer;

at least one channel provided in the membrane layer to separate a region of the membrane layer from the rest of the membrane layer, the region forming a first moveable portion of a vent structure, wherein the width of at least one portion of the channel varies to form an opening between the moveable portion and the rest of the membrane layer.

According to an example embodiment of a fourth aspect there is provided a MEMS transducer comprising:

a membrane layer;
a vent structure comprising a moveable portion;
a hole formed through the moveable portion.

BRIEF DESCRIPTION OF THE FIGURES

For a better understanding of the present invention, and to show how the same may be carried into effect, reference will now be made by way of example to the accompanying drawings in which:

FIGS. 2a and 2b provide a schematic diagram and a perspective view, respectively, of a known capacitive MEMS microphone device 100. The capacitive microphone device 100 comprises a membrane layer 101 which forms a flexible membrane which is free to move in response to pressure differences generated by sound waves. A first electrode 103 is mechanically coupled to the flexible membrane, and together they form a first capacitive plate of the capacitive microphone device. A second electrode 102 is mechanically coupled to a generally rigid structural layer or backplate 104, which together form a second capacitive plate of the capacitive microphone device. In the example shown in FIG. 2a the second electrode 102 is embedded within the backplate structure 104.

Figure 1:
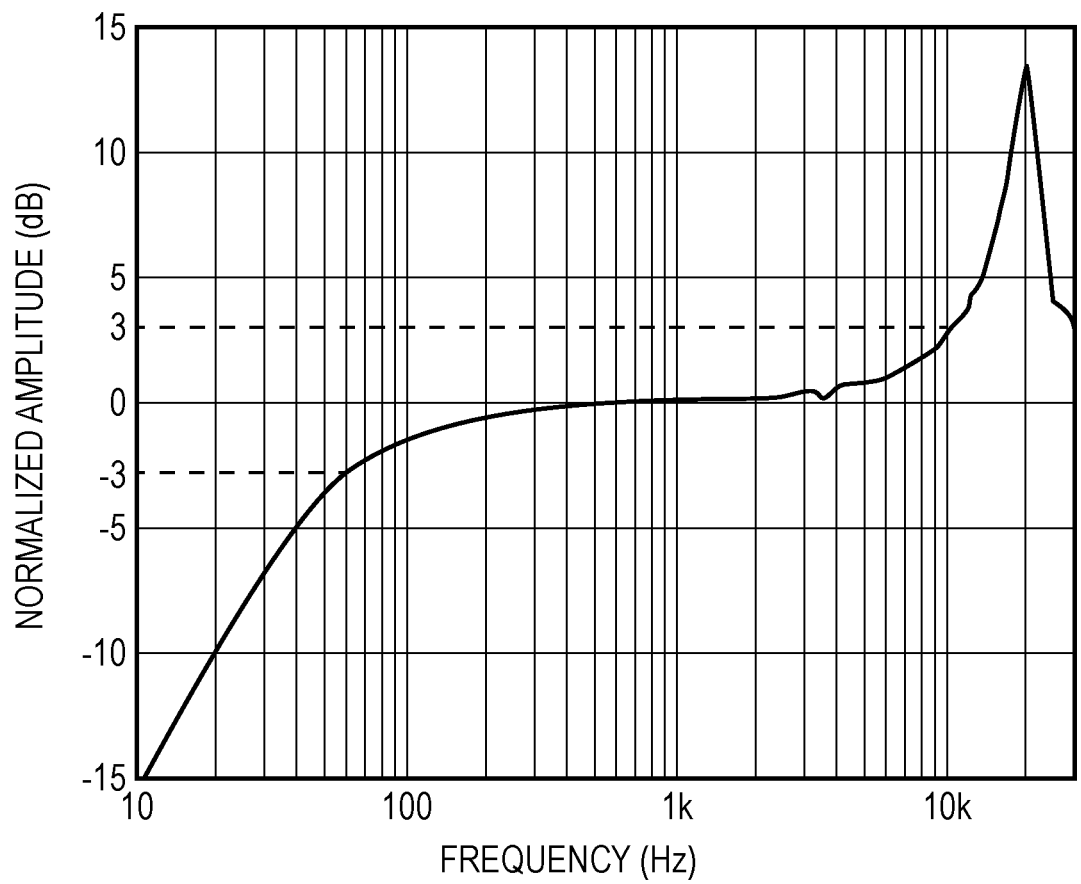
FIG. 1 illustrates the frequency response of a MEMS transducer.

The capacitive microphone is formed on a substrate 105, for example a silicon wafer, which may have upper and lower oxide layers 106, 107 formed thereon. A cavity or through-hole 108 in the substrate and in any overlying layers (hereinafter also referred to as a substrate cavity) is provided below the membrane, and may be formed for example using a "back-etch" through the substrate 105. The substrate cavity 108 connects to a first cavity 109 located directly below the membrane. These cavities 108 and 109 may collectively provide an acoustic volume thus allowing movement of the membrane in response to an acoustic stimulus. Interposed between the first and second electrodes 103 and 102 is a second cavity 110. A plurality of bleed holes 111 connect the first cavity 109 and the second cavity 110.

A plurality of acoustic holes 112 are arranged in the back-plate 104 so as to allow free movement of air molecules through the back plate, such that the second cavity 110 forms part of an acoustic volume with a space on the other side of the back-plate. The membrane 101 is thus supported between two volumes, one volume comprising cavities 109 and substrate cavity 108 and another volume comprising cavity 110 and any space above the back-plate. These volumes are sized such that the membrane can move in response to the sound waves entering via one of these volumes. Typically the volume through which incident sound waves reach the membrane is termed the "front volume" with the other volume, which may be substantially sealed, being referred to as a "back volume".

In some applications the backplate may be arranged in the front volume, so that incident sound reaches the membrane via the acoustic holes 112 in the backplate 104. In such a case the substrate cavity 108 may be sized to provide at least a significant part of a suitable back-volume. In other applications, the microphone may be arranged so that sound may be received via the substrate cavity 108 in use, i.e. the substrate cavity forms part of an acoustic channel to the membrane and part of the front volume. In such applications the backplate 104 forms part of the back-volume which is typically enclosed by some other structure, such as a suitable package.

Figure 2A:
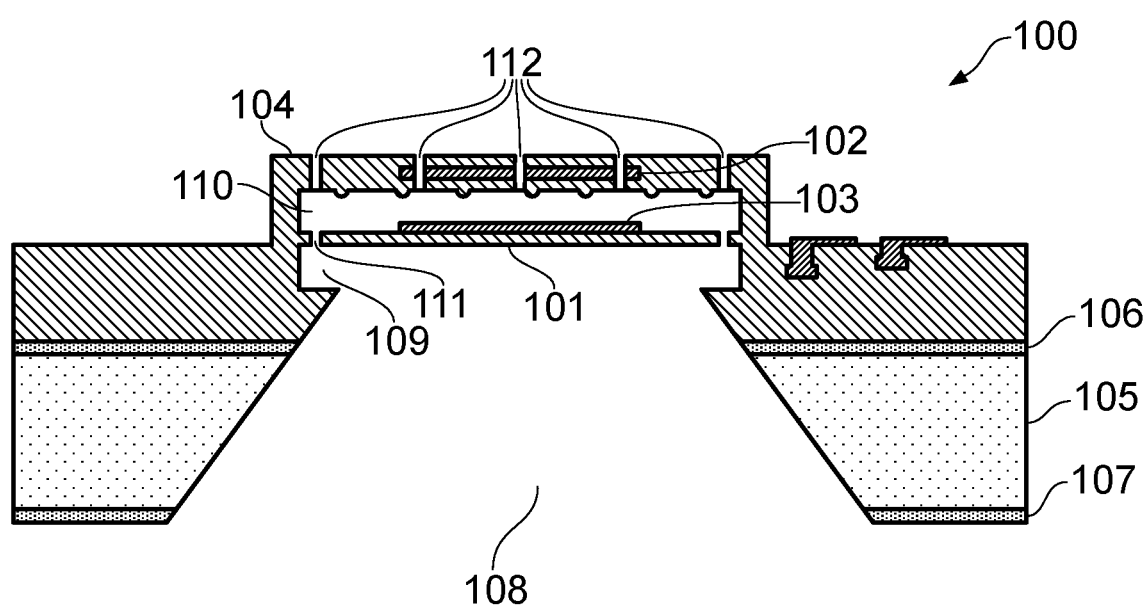
FIGS. 2a and 2b respectively illustrate known capacitive MEMS transducers in section and cut-away perspective views.
Figure 2B:
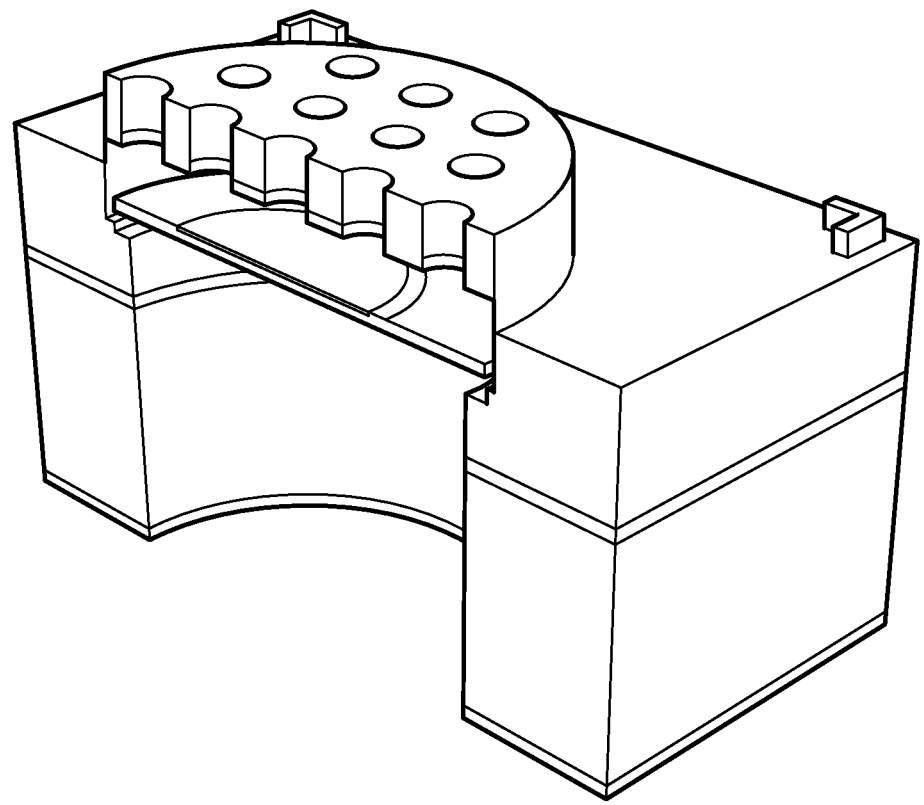

It should also be noted that whilst FIGS. 2a and 2b shows the backplate 104 being supported on the opposite side of the membrane to the substrate 105, arrangements are known where the backplate 104 is formed closest to the substrate with the membrane layer 101 supported above it.

As mentioned the membrane may be formed by depositing at least one membrane layer 101 over a first sacrificial material. In this way the material of the membrane layer(s) may extend into the supporting structure, i.e. the side walls, supporting the membrane. The membrane and back-plate layer may be formed from substantially the same material as one another, for instance both the membrane and back-plate may be formed by depositing silicon nitride layers. The membrane layer may be dimensioned to have the required flexibility whereas the back-plate may be deposited to be a thicker and therefore more rigid structure. Additionally various other material layers could be used in forming the back-plate 104 to control the properties thereof. The use of a silicon nitride material system is advantageous in many ways, although other materials may be used, for instance MEMS transducers using polysilicon membranes are known.

The flexible membrane layer of a MEMS transducer generally comprises a thin layer of a dielectric material—such as a layer of crystalline or polycrystalline material. The membrane layer may, in practice, be formed by several layers of material which are deposited in successive steps. The flexible membrane 101 may, for example, be formed from silicon nitride $Si_3N_4$ or polysilicon. Crystalline and polycrystalline materials have high strength and low plastic deformation, both of which are highly desirable in the construction of a membrane. The membrane electrode 102 of a MEMS transducer is typically a thin layer of metal, e.g. aluminium, which is typically located in the centre of the membrane 101, i.e. that part of the membrane which displaces the most. It will be appreciated by those skilled in the art that the membrane electrode may be formed by an alloy such as aluminium-silicon for example. The membrane electrode may typically cover, for example, around 40% of area of the membrane, usually in the central region of the membrane. Thus, known transducer membrane structures are composed of two layers of different material—typically a dielectric layer (e.g. SiN) and a conductive layer (e.g. AlSi).

Typically the membrane layer 101 and membrane electrode 102 may be fabricated so as to be substantially planar in the quiescent position, i.e. with no pressure differential across the membrane, as illustrated in FIG. 2a. The membrane layer may be formed so as to be substantially parallel to the back-plate layer in this quiescent position, so that the membrane electrode 102 is parallel to the back-plate electrode 103. However, over time, the membrane structure may become deformed—e.g. as a consequence of relatively high or repeated displacement—so that it will not return to exactly the same starting position.

In use, in response to a sound wave corresponding to a pressure wave incident on a MEMS microphone transducer, the membrane is deformed slightly from its equilibrium position. The distance between the lower electrode 103 and the upper electrode 102 is correspondingly altered, giving rise to a change in capacitance between the two electrodes that is subsequently detected by electronic circuitry (not shown). The bleed holes 111 allow the pressure in the first and second cavities to equalise over a relatively long timescale (in acoustic frequency terms) which reduces the effect of low frequency pressure variations, e.g. arising from temperature variations and the like, but without significantly impacting on sensitivity at the desired acoustic frequencies.

To be useful for use in portable electronic devices such transducers should be able to survive the expected handling and use of the portable device, which may include the device being accidentally dropped.

If a device such as a mobile telephone is subject to a fall, this can result not only in a mechanical shock due to impact but also a high pressure impulse incident on a MEMS transducer. For example, a mobile telephone may have a sound/acoustic port for a MEMS microphone on one face of the device. If the device falls onto that face, some air may be compressed by the falling device and forced into the sound port. This may result in a high pressure impulse incident on the transducer. It has been found that in conventional MEMS transducers of the form described above high pressure impulses can potentially lead to damage of the transducer.

The sacrificial material used to define the first and second cavities is dimensioned so as to provide a desired equilibrium separation between the membrane layer 101 and the substrate 105 and also between the membrane layer 101 and the back-plate 104 so as to provide good sensitivity and dynamic range in use. In normal operation the membrane may deform within the volume defined by the first and second cavities without contacting the back-plate and/or substrate 105.

Figure 3A:
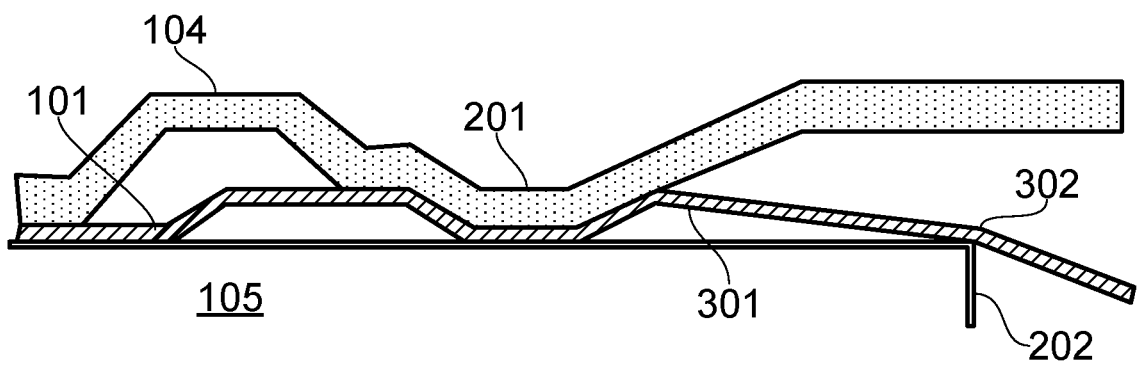
FIGS. 3a and 3b illustrate how a high pressure event may affect the membrane.
Figure 3B:
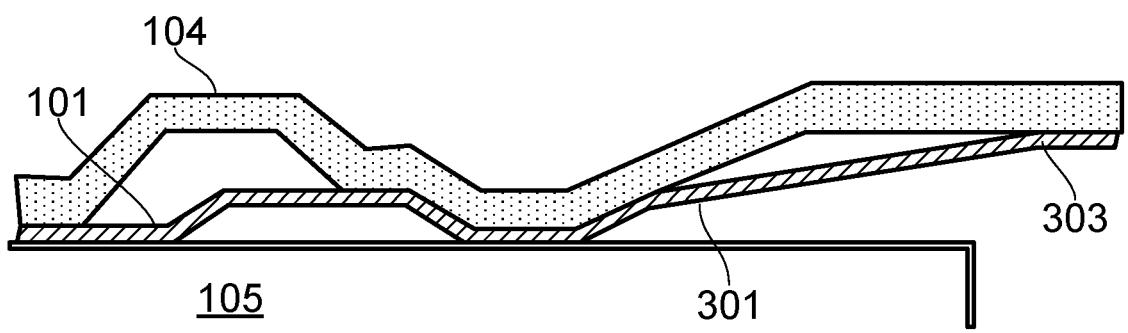

In response to a high pressure impulse however the membrane layer 101 may exhibit a greater amount of deformation than usual. FIG. 3a illustrates the situation where the membrane has been deformed downwards following a high pressure event and FIG. 3b shows the situation where the membrane has been displaced upwards.

Consider the situation where the microphone is arranged to receive incident sound from a sound port arranged above the back-plate 104 and the sound port pressure suddenly increases, for instance as a result of air trapped when the device falls being forced into the sound port. This may result the pressure in the second cavity 110 being significantly greater than the pressure in the first cavity 109, displacing the membrane downwards to greater extent than is usual. This may result in a relatively large stress at point 301 where membrane layer 101 forms part of the sidewall of supporting structure 201 and, in some instances, may thus result in delamination of the membrane layer from the rest of the sidewall structure. Further, if the pressure difference is great enough the membrane may make contact with the substrate 105 at the edge of the substrate defined by the side wall 202 of the opening of substrate cavity 108. Typically the edge of the substrate at the location of the opening of substrate cavity has a relatively sharp angle and thus the membrane may be deformed round this edge, leading to a large stress concentration at this point 302.

As mentioned previously the membrane layer 101 will typically be formed from one or more thin layers of semiconductor material, such as silicon nitride. Whilst such a material can be flexible when subject to even stresses, if there is a significant localised out-of-plane stress, such as may be introduced into the membrane at point 302 by contact with the edge of the opening of substrate cavity 108, the membrane material can be relatively brittle. Thus contact between the membrane and the edge of the opening of substrate cavity in this way can lead to damage such as cracking of the membrane.

The bleed holes 111 discussed above with relation to FIG. 2 will provide a flow path between the first and second cavities and thus flow of air through the bleed holes will reduce the pressure differential acting on the membrane over time. However the bleed holes are typically configured to provide a limited amount of flow so as to provide a desired low frequency response. Thus a high pressure differential may be maintained across the membrane for a relatively long period of time before flow through the bleed holes acts to equalise the pressures in the first and second cavities. The time taken to equalise via the bleed holes could be changed by altering the size and/or number of bleed hole but this may impact negatively on transducer performance.

As the high pressure caused by trapped air may persist for a relatively long time, the pressure in the first and second cavities may equalise by virtue of the bleed holes as discussed. Thus the pressure in the first cavity, and substrate cavity, may increase until the pressures are equalized. However once air is no longer being forced into the sound port the pressure in the sound port will reduce quite quickly and, as typically the back-plate has a low acoustic impedance, the pressure in the second cavity will quickly reduce. At this point the pressure in the first cavity may be significantly greater than the pressure in the second cavity and thus the membrane may be deformed upwards, again to a greater extent than may usually be the case. Again this may lead to a significant stress in region 301 where the membrane layer 101 meets the sidewall of the supporting structure. If the pressure difference is large enough the membrane may be displaced far enough to contact the back-plate 104. This may limit the amount of travel of the membrane as compared with the situation shown in FIG. 3a but again this may introduce stress into the membrane layer at the point 303 where it contacts the back-plate 104. Again it may take a while for this pressure differential to reduce by virtue of flow through the bleed holes.

It should be appreciated that both of these situations can also occur when sound is received via the substrate cavity 108 but in the opposite order.

According to a previously proposed MEMS transducer, the transducer membrane is provided with a variable vent structure in the form of a moveable portion or "flap". The moveable flap portion is preferably arranged such that its equilibrium or quiescent position—i.e. the position it adopts with substantially no pressure differential acting on the moveable portion, is within the plane of the rest of the membrane. In response to a pressure differential across the moveable portion of the vent structure the moveable portion is deflected away from the plane of the rest of the membrane so as to expose an aperture which provides a flow path through the membrane. In this way, the size of a flow path through the vent structure between a first volumes above the membrane to a second volume below the membrane is varied in response to a variable pressure differential acting on the moveable portion. Thus, the flap acts as a pressure relief valve and opens in order to provide a flow path through the membrane in response to a high pressure event, thereby tending to equalise the pressure above and below the membrane.

Figure 4A:
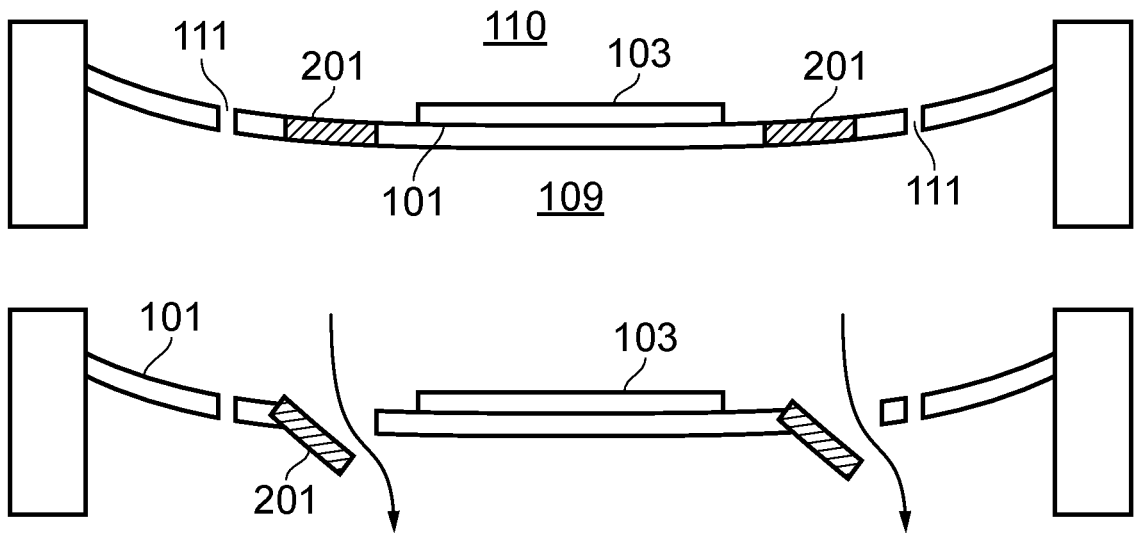
FIGS. 4a, 4b and 4c illustrate a known variable vent structure.
Figure 4B:
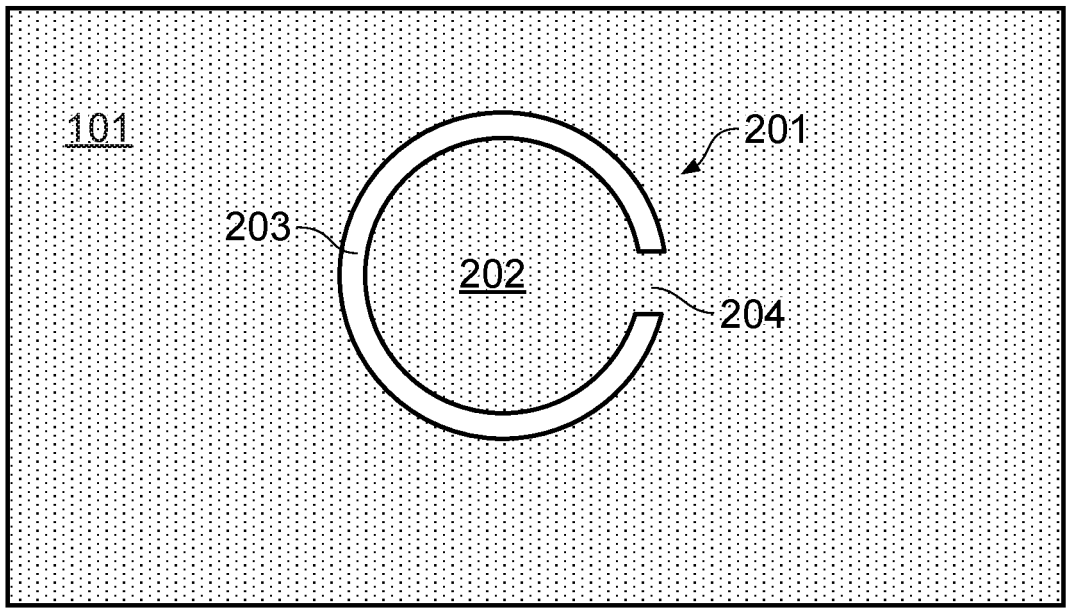
Figure 4C:
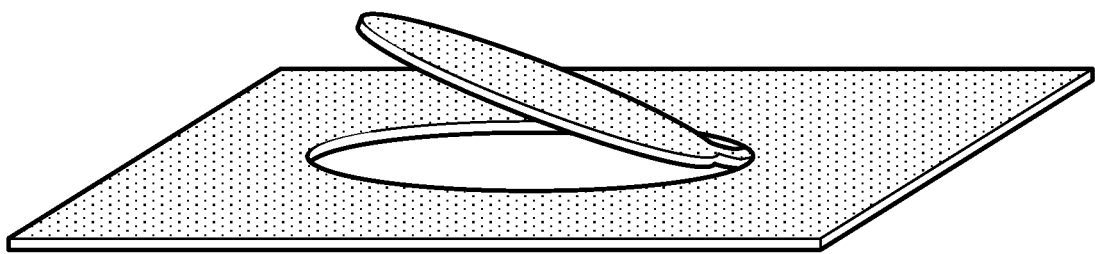

One proposed variable vent structure has a moveable portion which is moveable so as to open a hole extending between the volumes on either side of the membrane. FIGS. 4a, 4b and 4c illustrate such a known variable vent structure. FIG. 4a illustrates the flexible membrane 101 of a transducer such as described above in relation to FIGS. 2a and 2b (the rest of the transducer structure being omitted for clarity). The membrane is supported between a first volume, which includes cavity 109, and a second volume which includes cavity 110. As described above the membrane will typically have a plurality of bleed holes 111 which are dimensioned and arranged to produce a tuned effect on the transducer and reduce the impact of low frequency pressure variations. However such bleed holes are designed to have a limited impact on dynamic pressure variations at the acoustic frequencies of interest and thus provide very limited response to sudden high pressure events.

The transducer structure of FIG. 4a thus also includes variable vent structures 201 formed, as illustrated by FIGS. 4b and 4c, by movable portions 202 which are movable with respect to an aperture through the membrane 101. The moveable portion 202 is arranged to occupy at most of the area of the aperture at equilibrium pressure, i.e. when the first and second volumes are at substantially the same pressure. The moveable portion is moveable in response to a local pressure differential across the hole (i.e. between the front and back volume and thus across the membrane). In equilibrium the moveable portion will substantially close the aperture of the vent. If a pressure differential arises between the first and second volumes, the moveable portion is able to deflect away from the rest of the membrane layer so as to vary the degree to which the hole is closed.

The moveable portion 202 may be defined by etching one or more channels 203 through the membrane material 101 such that the moveable portion is attached to the rest of the membrane 101 by one or more connection points 204 and such that the moveable portion can be deflected from the rest of the membrane. The vent may be configured such that the moveable portion 202 is not significantly deflected, and thus remains substantially closing the vent aperture at pressure differentials that are within the normal expected operating range of the MEMS transducer but moves to increase the size of the flow path, e.g. close less of the hole, at higher pressure differentials that could potentially cause damage to the membrane.

Embodiments described herein relate to MEMS transducers comprising a layer of membrane material supported between a first volume and a second volume. The first volume may for instance comprise the first cavity 109 between the membrane and the substrate and/or the volume formed in the substrate 108. The second volume may comprise the second cavity 110 between the membrane and back-plate and/or any volume in fluid communication with the second cavity (e.g. a sound port in top-port embodiments). The layer of membrane material is supported relative to a substrate of the transducer to provide a flexible membrane.

To reduce the likelihood of damage in high pressure situations the transducer structure comprises at least one vent structure in communication with at least one of said first and second volumes. The vent structure comprises at least one moveable portion which is moveable in response to a pressure differential across the vent structure.

Embodiments provide one or more openings at the vent structure. When the moveable portion is in-plane with the rest of the membrane, an opening may be provided through the moveable portion of the vent structure, or may be provided between the moveable portion and the rest of the membrane. Since the configuration of the vent structure is changeable in response to changing pressure differentials across the membrane layer, it is convenient to consider an opening at the vent structure when the moveable portion is in-plane with the rest of the membrane; in this configuration the vent aperture will be substantially closed and the shape and size of an opening at the periphery of a moveable portion, i.e. between the moveable portion and the rest of the membrane layer, will be clearly defined.

FIGS. 5a, 5b and 5c and 6a, 6b and 6c illustrate a number of example embodiments of a membrane layer of, or for, a MEMS transducer, such a MEMS microphone.

Figure 5A:
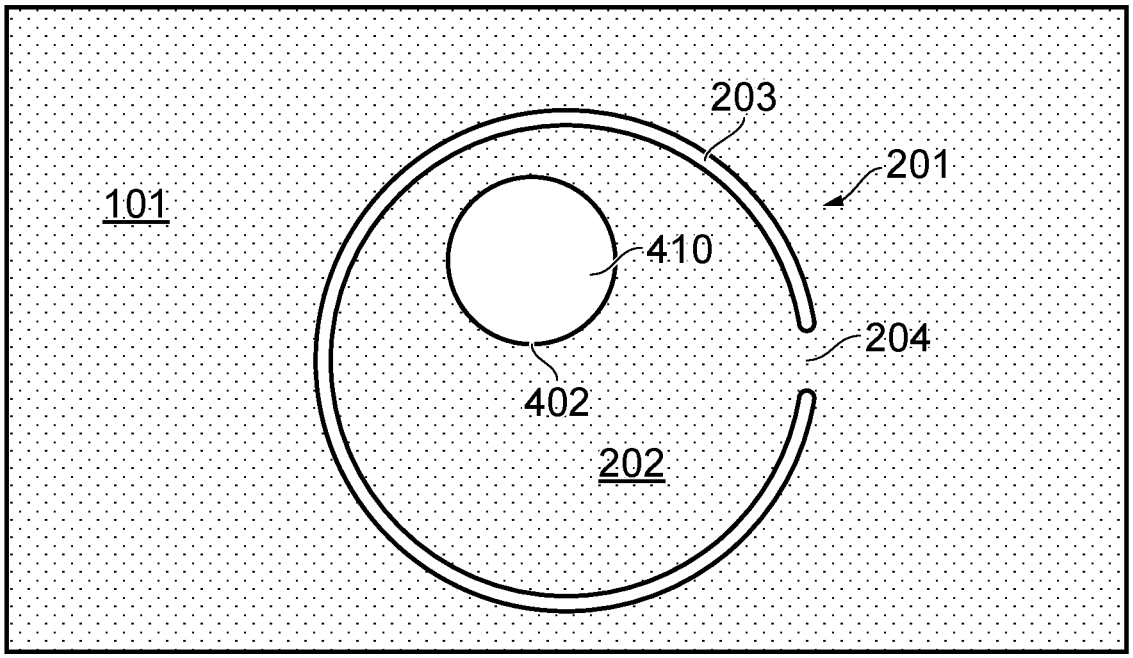
FIGS. 5a, 5b and 5c illustrate a part of a membrane layer comprising a vent structure having a moveable portion in plane with the rest of the membrane layer.
Figure 5B:
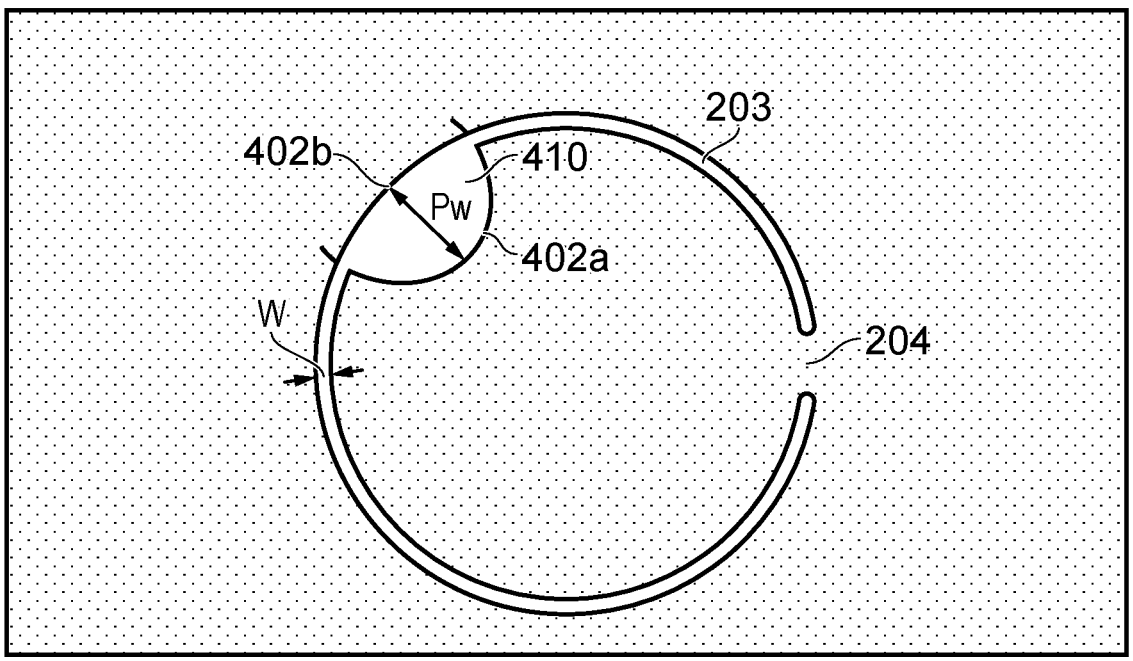
Figure 5C:
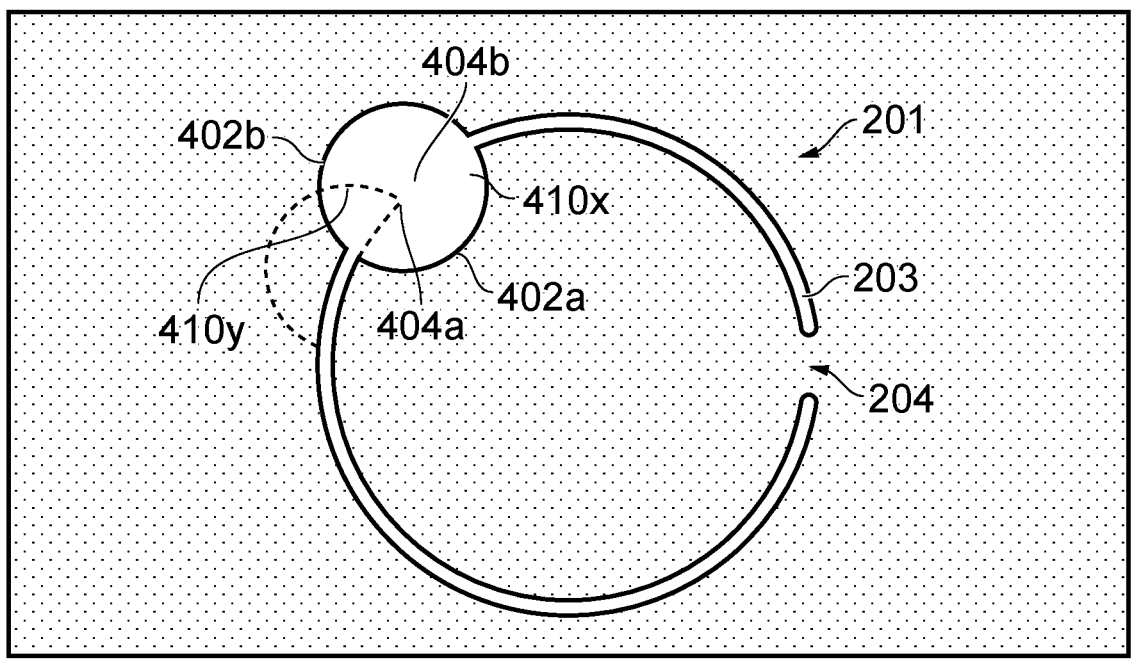

Thus, FIGS. 5a, 5b and 5c illustrate a part of a membrane layer 101 comprising a vent structure 201 at its equilibrium, or quiescent, position—i.e. when the pressure differential across the membrane layer is negligible and the moveable portion 202 is substantially in-plane with the rest of the membrane layer. The vent structure 201 is similar to the variable vent structure discussed above with respect to FIGS. 4a and 4b and further comprises an opening 410—otherwise known as a tuning hole—for tuning the frequency response of the transducer and in particular the low frequency response. The opening 410 provides a first flow path through the membrane layer at normal operating conditions below a first threshold pressure differential. The vent structure is operable to provide a second, variable, flow path through the membrane layer above a second threshold pressure differential.

In response to e.g. an impact event that gives rise to a significant pressure differential across the membrane, the moveable portion 202, and thus the peripheral edge of the opening 410 that is provided by membrane material of the moveable portion, will deflect. The plane of the opening, or hole, 410 can therefore be considered to deflect away from the plane of the rest of the membrane layer in response to a pressure differential across the vent structure. This is illustrated more clearly in FIGS. 6a and 6b and 6c which show the moveable portion corresponding to FIGS. 5a, 5b and 5c respectively, when deflected substantially orthogonally from the plane of the rest of the membrane layer 101.

Specifically, FIG. 5a illustrates a part of a membrane layer 101 of a MEMS transducer according to a first example. The membrane layer is provided with a vent structure 201 comprising a moveable portion 202 which is defined by a channel, or slit, 203 provided in the membrane layer 101. The membrane layer 101 also comprises an opening, or hole, 410 for tuning the frequency response of the transducer. In this example, the opening which comprises a region of absence of membrane material within the membrane layer, is provided within the moveable portion such that a perimeter, or peripheral edge 402, of the opening 410 is provided entirely by material of the moveable portion 202.

The opening, or void, 410 for tuning the frequency response of the transducer, which is provided at the vent structure, can be considered to be an area, or region, where the material forming the membrane layer is absent. In other words a "void" within the membrane layer. Thus, the opening, or window, 410 is a fixed-size region of the membrane layer without membrane material and is distinguished from the closable aperture of the vent hole which is exposed to a variable degree by the deflection of the moveable portion. At equilibrium, when the moveable portion will extend substantially in plane with the rest of the membrane layer so as to substantially close the vent aperture, the opening, or vacuity, 410 will be substantially bounded by the material of the membrane layer. Thus, the opening can be considered to comprise a region of absence bounded by a peripheral edge 402, wherein the peripheral edge is provided by membrane material of the membrane layer.

FIG. 5b illustrates a part of a membrane layer 101 of a MEMS transducer according to a second example. The membrane layer is again provided with a vent structure 201 comprising a moveable portion which is defined by a channel, or slit, 203 provided in the membrane layer 101. The channel is defined between two adjacent edges of membrane material. In this example a portion P of the channel exhibits a width Pw which is greater than the width w of the rest of the channel in order to provide an opening 410 for tuning the frequency response of the transducer. In this example, the opening 410, which may be considered to be a notch or cutaway is provided at the periphery of the moveable portion. Thus, only a part 402a of the perimeter, or peripheral edge of the opening 410 is provided by material of the moveable portion 202. The rest 402b of the peripheral edge of the opening 410 is provided by material of the rest of the membrane layer (i.e. not forming a part of the moveable portion and separated from the movable portion by the slit 203). Thus, the opening, or scoop, 410 will effectively form a region of absence between the between the perimeter section 502a of the moveable portion and the perimeter of the vent aperture when the vent structure is closed, as illustrated in FIG. 5b.

Figure 6A:
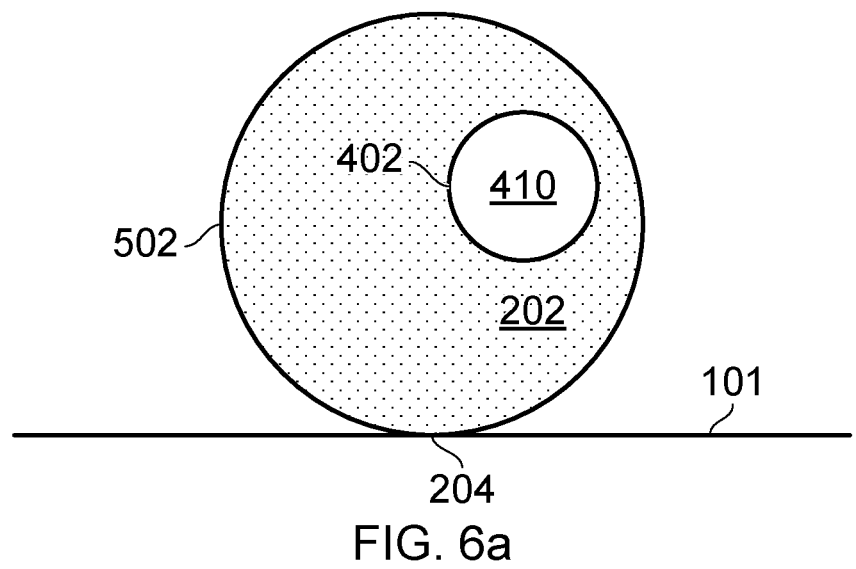
FIGS. 6a, 6b and 6c illustrate the moveable portion corresponding to FIGS. 5a, 5b and 5c respectively, when deflected substantially orthogonally from the plane of the rest of the membrane layer.
Figure 6B:
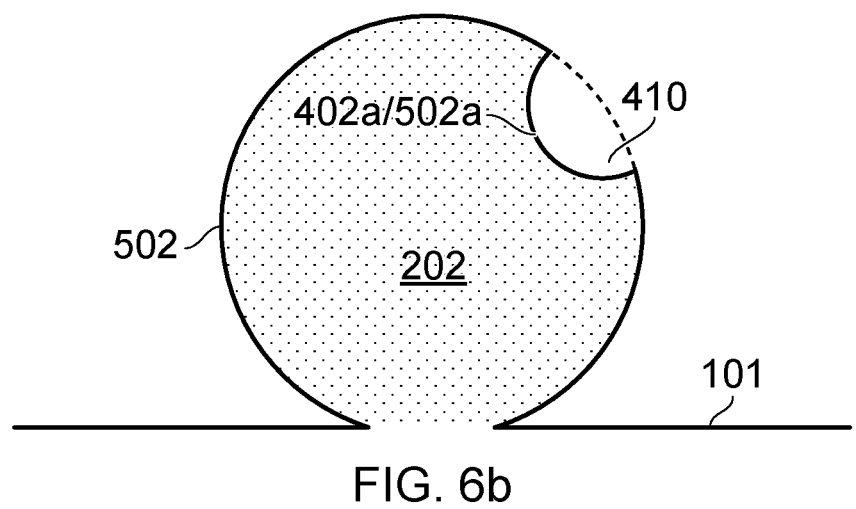

The part 402a of the peripheral edge of the opening 410 that is provided by the membrane material of the moveable portion 202 will also form a section 502a of the perimeter of the moveable portion. This is shown more clearly in FIG. 6b which illustrates the moveable portion 202 in a position deflected so as to extend substantially orthogonally with respect to the plane of the membrane layer 101. As illustrated in FIG. 6b, the moveable portion will appear to have a deficit or cut-away portion at the peripheral edge thereof. This cut away, or recess, portion forms the opening 410' within the membrane layer when the vent structure is at the equilibrium or quiescent position.

FIG. 5c illustrates a part of a membrane layer 101 of a MEMS transducer according to a third example. In this example, an opening 410 is provided at the vent structure, at the periphery of the moveable portion 202. The opening 410 comprises a first portion 410x—which extends in the plane of the moveable portion and is partially bounded by material of the moveable portion—and a second portion 410y—which extends in the plane of the membrane layer and is partially bounded by material of the rest of the membrane layer. When the moveable portion is disposed so as to be substantially in-plane with the rest of the membrane layer, the first and second portions are adjacent. The portion of the opening 410x that extends in the plane of the moveable portion can be considered to be bounded by a notional line 404a. Furthermore, the portion of the opening 402b that extends in the plane of the rest of the membrane layer and can be considered to be bounded by a notional line 404b. It will be appreciated that the channel 403 may be formed with a very narrow width and thus there will be minimal or negligible distance between the notional lines 404a and 404b. As a further example it will be appreciated that the first and second portions may be skewed relative to each other i.e. offset from one another, as shown by the dashed lined in FIG. 5c.

Thus, only a part 402a of the perimeter, or peripheral edge of the opening 410 is provided by material of the moveable portion 202. The rest 402b of the peripheral edge of the opening 410 is provided by material of the rest of the membrane layer (i.e. not forming a part of the moveable portion and separated from the movable portion by the slit 203. Thus, the opening 410 will effectively form a region of absence between the between the perimeter section 502a of the moveable portion and the perimeter of the vent aperture when the vent structure is considered at equilibrium as in FIG. 5b with the movable portion substantially in the same plane as the rest of the membrane layer.

Figure 6C:
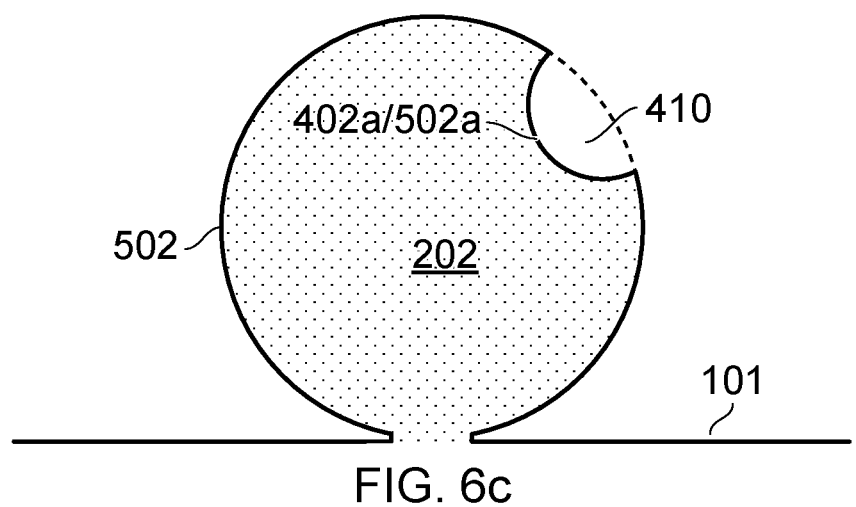

The part 402a of the peripheral edge of the opening 410 that is provided by the membrane material of the moveable portion 202 will also form a section 502a of the perimeter of the moveable portion. This is shown more clearly in FIG. 6c which illustrates the moveable portion 202 in a position deflected so as to extend substantially orthogonally with respect to the plane of the membrane layer 101. As illustrated in FIG. 6c, the moveable portion will appear to have a deficit or cut-away portion at the peripheral edge thereof. This cut away portion forms the first portion 410x of the opening within the membrane layer when the vent structure is at the equilibrium or quiescent position.

It will of course be appreciated that the channel 403 does represent a path for air to flow through the membrane. However the channel 403 may be formed with a very narrow width and thus there will be minimal or negligible air flow through the channel when the, or each, moveable portion is in plane with the rest of the membrane and the vent aperture is substantially. It will be appreciated that the width of channel 403 may be limited by the photolithographic process constraints on the minimum etchable gap, or the need for some mechanical clearance for the moveable portion(s) to bend and flex yet clear the rest of the vent structure. A typical width might be 1 μm, relative to a typical vent structure of 20 μm to 50 μm in extent. However the width might be ten times smaller or larger depending on the acoustic specifications or the manufacturing process capability. The slit dimensions will be taken into account when tuning the LF response.

Thus, according to example embodiments the vent structure provided in the membrane layer of a MEMS transducer is provided with one or more openings for tuning the frequency response of the transducer.

Each opening preferably has a constant diameter and hence its acoustical resistance is known to be constant. Thus, methods are provided for tuning the low-frequency response, in particular the −3 db point, by selecting the number of openings at the vent structure and/or by selecting the shape and/or size of the openings. The diameter of an opening may be in the range 1 um-10 um. The openings may be any shape including circular, square, and triangular or may be an irregular polygon in shape. A vent structure may be provided with one, or a plurality of, openings. In the case of a vent structure comprising a plurality of openings, the size and/or shape of the openings (when the moveable portion is in the same plane as the rest of the membrane) may be constant, or may vary between openings.

According to example embodiments, one or more openings for tuning the frequency response of a MEMS transducer are provided in the membrane layer, at the vent structure. It will be appreciated that the vent structures associated with a MEMS transducer are typically provided laterally outside a central region of the membrane. Thus, by locating the openings away from the central region of the membrane layer, the strength and robustness of the membrane layer can be improved. Integrating tuning holes with one or more vent structures thus represents an effective and efficient arrangement, which beneficially frees up space on the rest of the membrane layer.

Thus, according to example embodiments, the MEMS transducer can be considered to comprise a dual flow-path vent structure which provides a first flow path through the membrane when the pressure differential across the membrane is below a first threshold, and a second flow path through the membrane when the pressure differential across the membrane is above a second threshold. The first threshold may for example be between 20 uPa (0 dB) and 1 kPa, the second threshold may be between 1 kPa and 20 kPa. The first flow path is for controlling and/or tuning the low frequency response of the transducer, whilst the second flow path is for protecting the membrane from damage during a high pressure event by facilitating the rapid equalisation of pressure across the membrane.

Furthermore, by locating the or each of the openings required for tuning the frequency response of the transducer at the vent structure—i.e. through a moveable portion of the vent structure or between a moveable portion and the rest of the membrane layer and/or another moveable portion of the vent structure—any stresses arising within the membrane material as a consequence of opening(s) provided through the moveable portion will be separated from the rest of the membrane layer by the slit that defines the moveable portion of the vent structure. In this sense the openings are substantially stress-isolated from the rest of the membrane layer. Also, the strength/robustness of the membrane layer is significantly less compromised by the provision of tuning holes at the vent structure as compared to arrangements where one or more openings are provided through a central region of the membrane.

Figure 7:
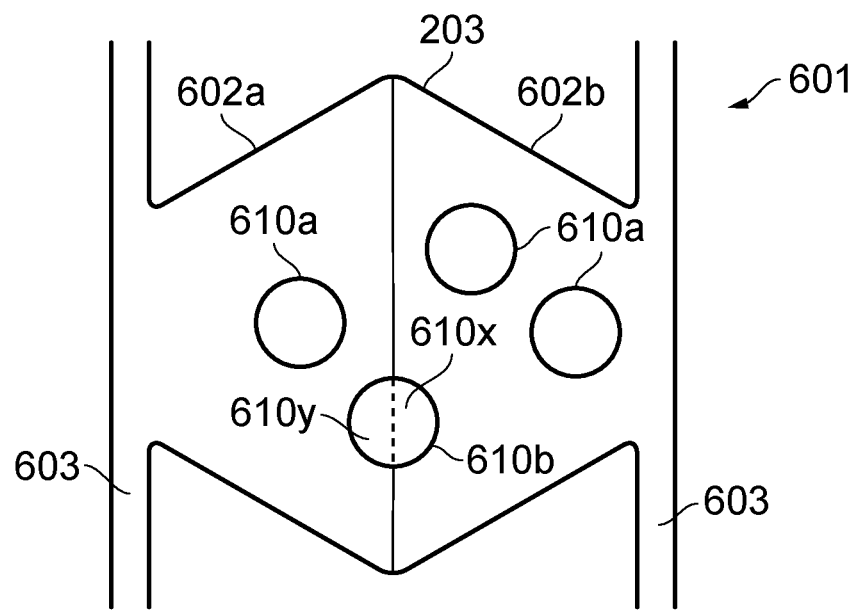
FIG. 7 illustrates a further example embodiment of a vent structure provided in the membrane layer of a MEMS transducer.

FIG. 7 illustrates a further example embodiment of a vent structure 601 provided in the membrane layer of a MEMS transducer. The vent structure 601 comprises first and second moveable portions 602a and 602b which are connected to the rest of the membrane by a joint structure comprising a beam structure 603. Thus, FIG. 7 illustrates a vent structure 601 when the moveable portions are substantially in-plane with the rest of the membrane layer. The moveable portions therefore tessellate to substantially close the vent aperture.

The vent structure 601 comprises a plurality of openings 610. Three of the openings 610a are formed through a moveable portion of the vent structure such that the periphery of the opening is entirely provided by material of the respective moveable portion. One of the openings 610b is provided such that, when the moveable portions are substantially in-plane with the rest of the membrane layer, the opening is between the first and second moveable portions 602a and 602b. The opening can be considered to comprise a first portion 610x—which extends in the plane of the first moveable portion 602a and is partially bounded by material of the first moveable portion—and a second portion 610y which extends in the plane of the second moveable portion 602b and is partially bounded by material of the second moveable portion. When the vent structure is closed and the moveable portions are substantially in plane with the rest of the membrane, the first and second portions are adjacent and thus form the opening 610.

Figure 8:
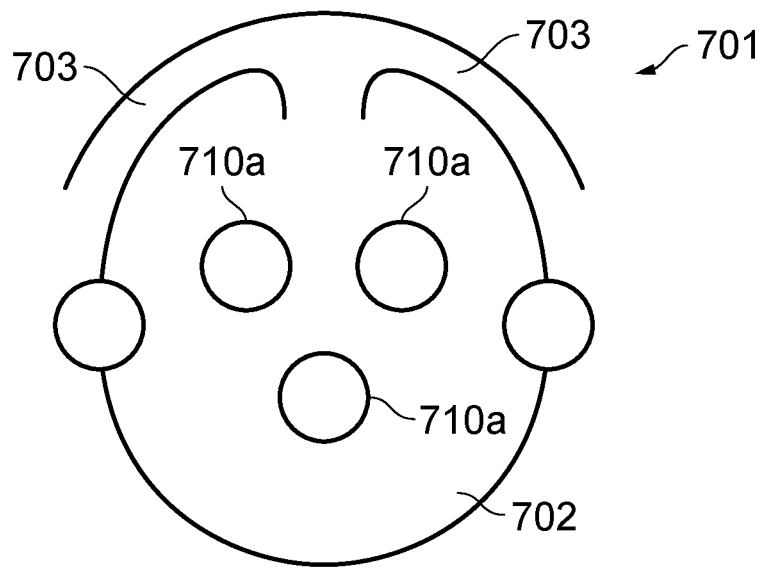
FIG. 8 illustrates a further example embodiment of a vent structure provided in the membrane layer of a MEMS transducer.

FIG. 8 illustrates a further example embodiment of a vent structure 701 provided in the membrane layer of a MEMS transducer. The vent structure 701 comprises a single moveable portion 702 connected to the rest of the membrane by a joint structure comprising a beam structure 703. Thus, FIG. 8 illustrates a vent structure 701 when the moveable portion is substantially in-plane with the rest of the membrane layer.

The vent structure 701 comprises a plurality of openings 710. Three of the openings 710a are formed through the central region of the moveable portion such that the periphery of the opening is entirely provided by material of the moveable portion 702. Two further openings 710b are provided at the periphery of the moveable portion such that, when the moveable portion is substantially in-plane with the rest of the membrane layer as illustrated in FIG. 8, the openings 710b are between the moveable portion 702 and the rest of the membrane. When the moveable portion 702 is deflected away from the plane of the rest of the membrane, the portion of each of the openings 710b which extends in the plane of the moveable portion will effectively define a recess or deficit at the peripheral edge of the moveable portion.

Figure 9:
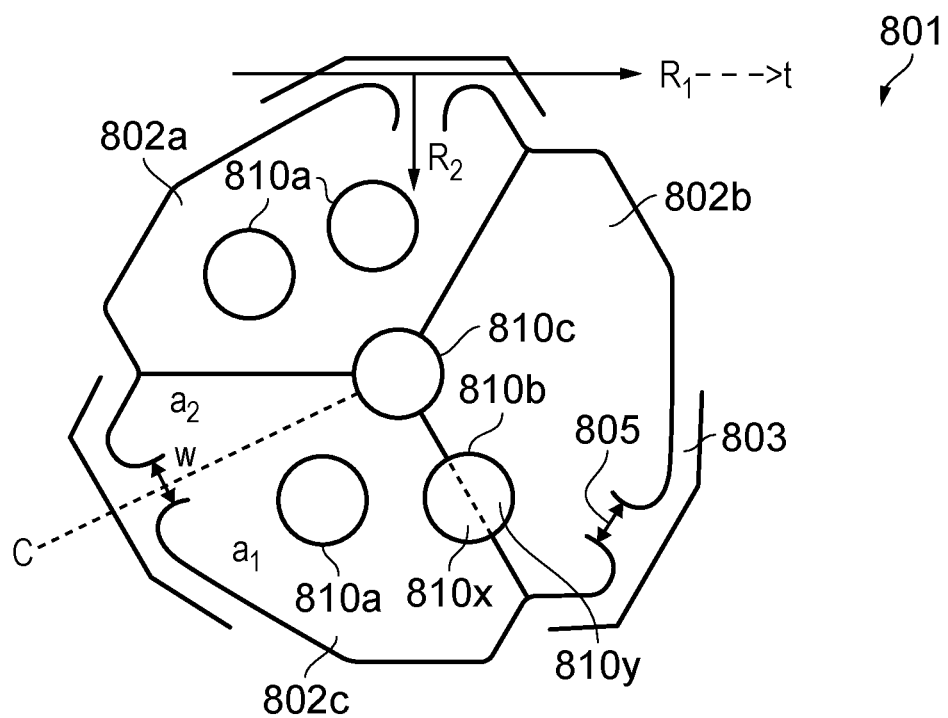
FIG. 9 illustrates a further example embodiment of a vent structure provided in the membrane layer of a MEMS transducer.

FIG. 9 illustrates a further example embodiment of a vent structure 801 provided in the membrane layer of a MEMS transducer. The vent structure 801 comprises first, second and third moveable portions 802a, 802b and 802c respectively. Each of the moveable portions is an irregular polygon and is connected to the rest of the membrane by a joint structure. In this example the joint structure comprises a connecting portion 805 and a beam structure 803. Thus, FIG. 9 illustrates the vent structure 801 when the moveable portions are substantially in-plane with the rest of the membrane layer. The moveable portions therefore tessellate to substantially close the vent aperture.

As illustrated with respect to the third moveable portion 802c, each of the moveable portions can be considered to extend either side of a notional "centre-line" C which extends from the centre of the joint structure across the moveable portion in a direction that is substantially orthogonal to a line coincident with, or parallel to, the width w of the connecting portion. The centre-line C dissects the moveable portion into first and second sections a1 and a2. The moveable portion is asymmetrical about the notional centre-line C and the first section a1 can be seen to exhibit a larger surface area than the second section a2.

Following an event which gives rise to a pressure differential between the pressure experienced on the upper and lower surfaces of the membrane, the moveable portions 802a, 802b and 802c deflect out of the plane of the membrane to reveal the vent aperture. In particular, according to this vent configuration and as illustrated with respect to moveable portion 802a, each of the moveable portions is able to rotate about first and second rotational axes R1 and R2. The first rotational axis R1 of each moveable portion is substantially coincident with, or parallel to, the elongate portion of the beam 803. Thus, the first rotational axis R1 can be considered to have a tangential component t—i.e. a component that can be resolved tangentially with respect to the vent structure or aperture. In this particular example the first rotational axis is substantially coincident with the tangential component. The second rotational axis R2 extends across the vent structure in the plane of the membrane. Thus R2 has a component Rc which extends from the joint structure towards the centre of the vent structure in the plane of the membrane. The second rotational axis R2 may be substantially orthogonal to the first rotational axis R1.

The rotational movement that takes place about the second rotational axis R2 tends to cause the movable portions to "tilt". Thus, the lateral edge of section a1 of the moveable portion will initially deflect upwardly with respect to the plane of the membrane, whilst the lateral edge of section a2 of the moveable portion will initially deflect downwardly with respect to the plane of the membrane.

According to the vent configuration shown in FIG. 9, at relatively low differential pressure, when the vent structure is closer to the equilibrium position, a pressure differential across the vent tends to give rise to a greater rotation about R2 than R1. Continued deflection of the moveable portions about the second axis of rotation tends to cause a larger proportion of the aperture to be revealed (and thus a larger flow path) than would be revealed as a result of rotation about the R1. This enables the vent structure to open more quickly from the equilibrium position in response to a high pressure event and, thus, for a larger aperture to be revealed in response to relatively low pressure differentials. This beneficially enables a faster equalisation of the relative pressure above and below the membrane, thereby protecting the transducer from potential damage.

The vent structure 801 also comprises a plurality of openings for controlling and/or tuning the frequency response of the transducer. Specifically, the first moveable portion 802a is provided with two openings 810a which are provided through the first moveable portion. The third moveable portion 802c is also provided with an opening 810a which is provided through the third moveable portion.

The third moveable portion is provided with an opening 810b such that, when the moveable portions are substantially in-plane with the rest of the membrane layer, the opening 810b is between the third and second moveable portions 802c and 802b respectively. The opening 810b can be considered to comprise a first portion 810x—which extends in the plane of the third moveable portion 802b and is partially bounded by material of the third moveable portion—and a second portion 810y which extends in the plane of the second moveable portion 802b and is partially bounded by material of the second moveable portion. When the vent structure is closed and the moveable portions are substantially in plane with the rest of the membrane, the first and second portions are adjacent and thus form the opening 810b.

A further opening 810c is also provided such that when the moveable portions are substantially in-plane with the rest of the membrane layer, the opening 810c is at the centre of the vent structure and is disposed between the first, second and third moveable portion.

One or more transducers according to the any of the example embodiments described above may be incorporated in a package. FIGS. 10a to 10g illustrate various different packaging arrangements. FIGS. 10a to 10g each show one transducer element located in the package but it will be appreciated that in some embodiments there may be more one than transducer, e.g. a transducer array, and the various transducers may be formed on the same transducer substrate, i.e. a monolithic transducer substrate, or may be formed as separate transducers with separate transducer substrates each separate transducer substrate being bonded to a package substrate.

Figure 10A:
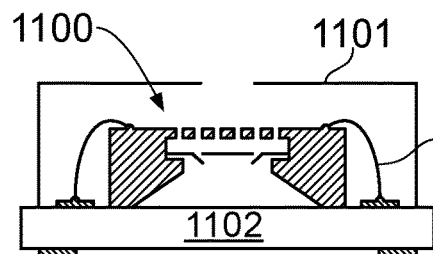
FIGS. 10a to 10h illustrate various MEMS transducer packages.

FIG. 10a shows a first arrangement where a transducer 1100 is located in a cover 1101, which forms at least part of a housing, on a package substrate 1102. The cover in this example could be a metallic housing which is bonded to the substrate. The package substrate may comprise at least one insulating layer. The package substrate may also comprise at least one conductive layer. The package substrate may be a semiconductor material or may be formed from a material such as PCB, ceramic or the like. Where the cover 1101 is metallic, or itself comprises a conductive layer, the cover may be electrically coupled to the conductive layer of the substrate, e.g. so that the housing provides shielding for electromagnetic interference (EMI). Bond wires 1103 may connect the transducer to bond pads on the package substrate. In some embodiments, read-out circuitry, for instance amplifier circuitry, may be located within the housing formed in or connected to the package substrate. Through-vias through the package substrate (not illustrated) may connect to contacts, i.e. solder pads, 1104 for electrically connecting external circuitry (not illustrated) to the package to allow transmission of electrical signals to/from the transducer 1100. In the example shown in FIG. 8a there is a sound port or acoustic port in the cover 1101 to allow sound to enter the package. According to convention, the configuration shown in FIG. 10a—in which the sound port is provided on opposite side of the package to the external electrical connection—is known as a "top port" configuration.

Figure 10B:
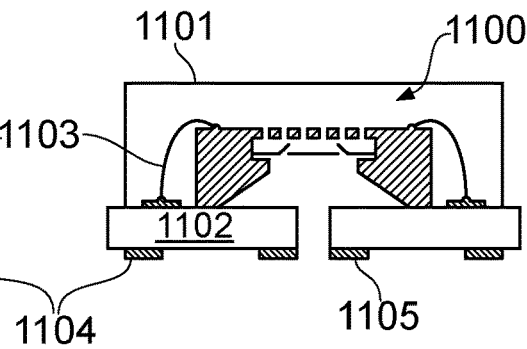

FIG. 10b illustrates an alternative arrangement where the sound port is provided in the package substrate 1102 and may, in use, be sealed. A ring 1105, which may be a sealing ring or a solder pad ring (for use in forming a solder ring) may be provided around the periphery of the sound port on the outer side of the package to allow, in use, sealing of a sound path leading to the sound port when the package is connected to another PCB for example. In this embodiment the transducer is arranged in a bottom port arrangement (i.e. the sound port is provided on the same side of the package to the external electrical connection) with the volume defined by the housing 1101 forming part of the back-volume of the transducer.

Figure 10C:
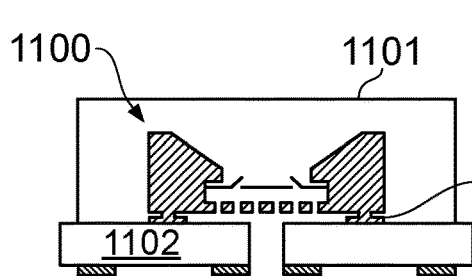

FIG. 10c illustrates an example where instead of bond wires connecting the transducer to the package substrate the transducer structure is inverted and flip-chip bonded to package substrate via connections 1106. In this example the sound port is in the package substrate such that the package is arranged in a bottom port arrangement.

Figure 10D:
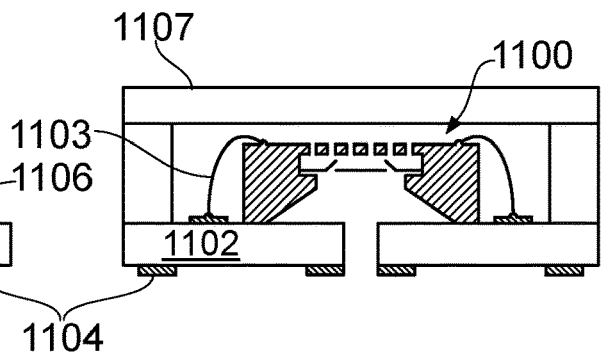
Figure 10E:
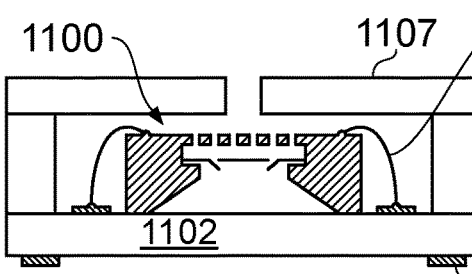
Figure 10F:
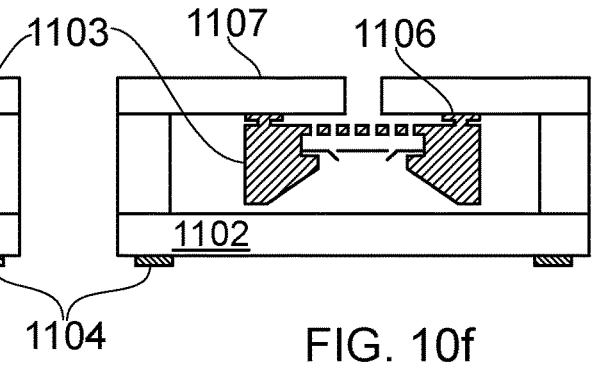
Figure 10G:
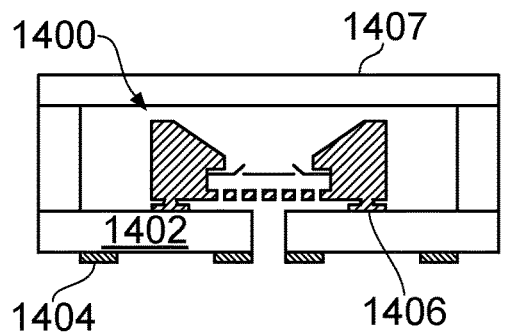

FIG. 10d illustrates an alternative example to that of FIG. 10b wherein a housing 1107 is formed from various panels of material, for example PCB or the like. In this instance the housing 1107 may comprise one or more conductive layers and/or one or more insulating layers. FIG. 10d shows the sound port in the package substrate. FIG. 10e shows an alternative arrangement to that of FIG. 10b wherein a housing 1107 is formed from various panels of material, for example PCB or the like as described in relation to FIG. 10d. FIG. 10f shows a further embodiment where the transducer structure is bonded via connections 1106 to the housing upper layer, which may for instance be PCB or layered conductive/insulating material. In this example however the electrical connections to the package are still via contacts, solder pads, 1104 on the package substrate, e.g. through-vias (not illustrated) in the package substrate with conductive traces on the inside of the housing to the transducer. FIG. 10g illustrates an alternative example to that of FIG. 10c wherein a transducer is flip-chip bonded to the package substrate in a housing 1107 formed from panels of material, for example PCB or the like as described in relation to FIG. 10d.

Figure 10H:
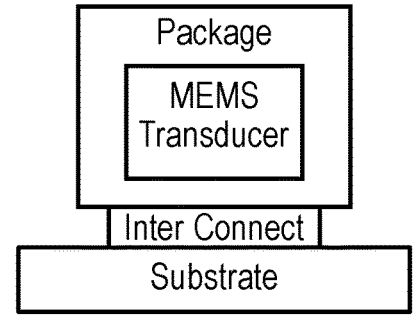

In general, as illustrated in FIG. 10*h*, one or more transducers may be located in a package, the package is then operatively interconnected to another substrate, such as a mother-board, as known in the art.

Figure 11A:
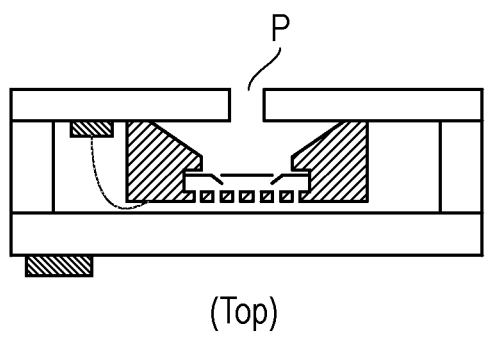
FIGS. 11a and 11b show further transducer packages.
Figure 11B:
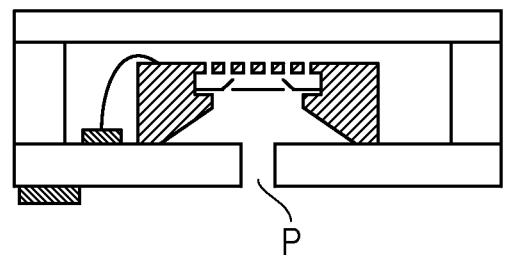

Example embodiments of the invention are particularly beneficial in package configurations, such as those shown in FIGS. 11*a* and 11*b* which respectively illustrate a top port and a bottom port configuration, wherein the MEMS die is arranged so that the membrane directly faces the acoustic port to allow direct acoustic coupling between the membrane and the acoustic port. It will be appreciated that providing one or more openings in the membrane layer potentially allows contaminants or partials to enter the acoustic volume of the transducer between the membrane and the backplane. However, by locating the openings at the vent structure, wherein the vent structure is provided away from a central region of the membrane which directly overlies/underlies the acoustic port of the package, and in conjunction with a package configuration as illustrated in FIG. 11*a* or FIG. 11*b*, problems associated with contamination are alleviated.

The transducer may comprise a back-plate structure wherein the membrane layer is supported with respect to said back-plate structure. The back-plate structure may comprises a plurality of holes through the back-plate structure.

The transducer may be a capacitive sensor such as a microphone. The transducer may comprise readout circuitry (analogue and/or digital). The transducer and circuitry may be provided together on a single semiconductor chip—e.g. an integrated microphone. Alternatively, the transducer may be on one chip and the circuitry may be provided on a second chip. The transducer may be located within a package having a sound port, i.e. an acoustic port. The transducer may be implemented in an electronic device which may be at least one of: a portable device; a battery powered device; an audio device; a computing device; a communications device; a personal media player; a mobile telephone; a tablet device; a games device; and a voice controlled device.

It will be appreciated that the illustrated embodiments are examples only and that embodiments may comprise vent structures of any design and incorporating any number of moveable portions and that the/each moveable portion may be any shape such as circular, triangular, rectangular, square or polygonal. For example, the vent structure shown in FIG. 8 comprises three moveable portions arranged around the periphery of the membrane aperture. However, it will be appreciated that this design can be generalised to incorporate any number of moveable portions, of any shape including club/clover shaped.

The embodiments have been described in terms of venting air from a volume. The same principles apply to other gases and indeed other fluids, possibly including liquids. In some embodiments the transducer may be arranged in a sealed environment which is filled with a fluid other than air, the sealed environment being arranged to allow transmission of pressure waves to/from outside the sealed environment. There may still be large pressure differentials that can be generated within the sealed environment and the use of variable vents in such embodiments may be beneficial.

Although the various embodiments describe a MEMS capacitive microphone, the invention is also applicable to any form of MEMS transducers other than microphones, for example pressure sensors or ultrasonic transmitters/receivers.

Examples described herein may be usefully implemented in a range of different material systems, however the examples described herein are particularly advantageous for MEMS transducers having membrane layers comprising silicon nitride.

It is noted that the example embodiments described above may be used in a range of devices, including, but not limited to: analogue microphones, digital microphones, pressure sensor or ultrasonic transducers. The example embodiments may also be used in a number of applications, including, but not limited to, consumer applications, medical applications, industrial applications and automotive applications. For example, typical consumer applications include portable audio players, laptops, mobile phones, PDAs and personal computers. Example embodiments may also be used in voice activated or voice controlled devices. Typical medical applications include hearing aids. Typical industrial applications include active noise cancellation. Typical automotive applications include hands-free sets, acoustic crash sensors and active noise cancellation.

Features of any given aspect or example embodiment may be combined with the features of any other aspect or example embodiment and the various features described herein may be implemented in any combination in a given embodiment.

Associated methods of fabricating a MEMS transducer are provided for each of the example embodiments.

It should be understood that the various relative terms upper, lower, top, bottom, underside, overlying, underlying, beneath, etc. that are used in the present description should not be in any way construed as limiting to any particular orientation of the transducer during any fabrication step and/or it orientation in any package, or indeed the orientation of the package in any apparatus. Thus the relative terms shall be construed accordingly.

It should be understood that reference to the transducer and/or integrated circuit being "mounted on" the first member should be interpreted as requiring that the transducer and/integrated circuit are directly mounted on the first member, but should encompass examples in which the transducer and/or integrated circuit are indirectly mounted on the first member. Thus, one or more other layers may be provided between the first member and the transducer and/or integrated circuit.

In the examples described above it is noted that references to a transducer may comprise various forms of transducer element. For example, a transducer may be typically mounted on a die and may comprise a single membrane and back-plate combination. In another example a transducer die comprises a plurality of individual transducers, for example multiple membrane/back-plate combinations. The individual transducers of a transducer element may be similar, or configured differently such that they respond to acoustic signals differently, e.g. the elements may have different sensitivities. A transducer element may also comprise different individual transducers positioned to receive acoustic signals from different acoustic channels.

It is noted that in the examples described herein a transducer element may comprise, for example, a microphone device comprising one or more membranes with electrodes for read-out/drive deposited on the membranes and/or a substrate or back-plate. In the case of MEMS pressure sensors and microphones, the electrical output signal may be obtained by measuring a signal related to the capacitance between the electrodes. The examples are also intended embrace a transducer element being a capacitive output transducer, wherein a membrane is moved by electrostatic forces generated by varying a potential difference applied across the electrodes, including examples of output transducers where piezo-electric elements are manufactured using MEMS techniques and stimulated to cause motion in flexible members.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference signs in the claims shall not be construed so as to limit their scope.

The invention claimed is:

1. A micro-electro-mechanical system (MEMS) transducer comprising:
    a membrane layer; and
    a dual flow-path vent structure formed in the membrane layer, wherein the dual flow-path vent structure provides a first flow path through the membrane when the pressure differential across the membrane is below a first threshold, and a second flow path through the membrane when the pressure differential across the membrane is above a second threshold, the first threshold being between 20 uPa and 1 kPa and the second threshold being between 1 kPa and 20 kPa.

2. The MEMS transducer as claimed in claim 1, wherein the dual flow-path vent structure comprises at least one moveable portion, the moveable portion being able to deflect away from the plane of the rest of the membrane layer in response to a pressure differential across the membrane above said second threshold,
    wherein, when the first moveable portion is substantially in-plane with the rest of the membrane layer, the vent structure comprises at least one opening in the membrane layer for controlling the frequency response of the transducer.

3. The MEMS transducer as claimed in claim 2, wherein the opening is formed through the moveable portion or is defined between i) the first moveable portion and ii) the rest of the membrane and/or a second moveable portion of the vent structure.

4. The MEMS transducer as claimed in claim 2, wherein the opening comprises a region of absence, or void, within the membrane layer where the material forming the membrane layer is absent.

5. The MEMS transducer as claimed in claim 4, wherein the opening comprises a peripheral edge which defines a substantially closed shape and wherein membrane material of the first moveable portion forms at least a part of the peripheral edge of the opening.

6. The MEMS transducer as claimed in claim 5, wherein the entirety of the peripheral edge of one said opening is provided by membrane material of the moveable portion.

7. The MEMS transducer as claimed in claim 5, wherein membrane material of the rest of the membrane layer forms at least a part of the peripheral edge of the opening.

8. The MEMS transducer as claimed in claim 5, wherein the vent structure comprises a plurality of moveable portions and wherein membrane material of a moveable portion other than the first moveable portion forms at least a part of the peripheral edge of the opening.

9. The MEMS transducer as claimed in claim 8, wherein the vent structure comprises three moveable portions.

10. The MEMS transducer as claimed in claim 2, wherein one said opening is formed at a periphery of the moveable portion.

11. The MEMS transducer as claimed in claim 2 wherein when the pressure differential across the membrane is above said second threshold the, or each, moveable portion deflects to expose an aperture in the membrane layer, the aperture providing a variable flow path through the membrane layer.

12. The MEMS transducer as claimed in claim 2, wherein the, or each, moveable portion is rotatable about first and second axes of rotation, which axes of rotation extend in the plane of the membrane.

13. The MEMS transducer as claimed in claim 1, wherein the vent structure is at least partially provided laterally outside a central region of the membrane where the membrane layer overlies the substrate cavity.

14. The MEMS transducer as claimed in claim 1, further comprising a back-plate structure wherein the membrane layer is supported with respect to said back-plate structure.

15. The MEMS transducer as claimed in claim 14, wherein said back-plate structure comprises a plurality of holes through the back-plate structure.

16. The MEMS transducer as claimed in claim 1, wherein said transducer comprises a capacitive sensor or a microphone.

17. The MEMS transducer as claimed in claim 16, further comprising readout circuitry, wherein the readout circuitry may comprise analogue and/or digital circuitry.

18. An electronic device comprising a MEMS transducer as claimed in claim 1 wherein said device is at least one of: a portable device; a battery powered device; an audio device; a computing device; a communications device; a personal media player; a mobile telephone; a games device; and a voice controlled device.

19. An integrated circuit comprising a MEMS transducer as claimed in claim 1 and readout circuitry.

* * * * *